United States Patent
Noro et al.

(10) Patent No.: US 9,039,257 B2
(45) Date of Patent: May 26, 2015

(54) LIGHTING DEVICE AND LIGHT-EMITTING MODULE

(71) Applicant: PANASONIC CORPORATION, Osaka (JP)

(72) Inventors: Koji Noro, Osaka (JP); Katsushi Seki, Shiga (JP); Ryusuke Kotera, Osaka (JP); Youji Tachino, Nara (JP); Satoshi Fukano, Nara (JP); Akihiro Hirano, Shiga (JP)

(73) Assignee: PANASONIC INTELECTUAL PROPERTY MANAGEMENT CO., LTD., Osaka (JP)

(*) Notice: Subject to any disclaimer, the term of this patent is extended or adjusted under 35 U.S.C. 154(b) by 43 days.

(21) Appl. No.: 14/108,805

(22) Filed: Dec. 17, 2013

(65) Prior Publication Data

US 2014/0177240 A1 Jun. 26, 2014

(30) Foreign Application Priority Data

Dec. 20, 2012 (JP) ................................ 2012-278540

(51) Int. Cl.
*F21V 15/04* (2006.01)
*F21V 19/00* (2006.01)
(Continued)

(52) U.S. Cl.
CPC .............. *F21V 15/04* (2013.01); *F21V 19/0035* (2013.01); *F21Y 2101/02* (2013.01); *F21Y 2105/001* (2013.01); *F21S 8/04* (2013.01); *H01L 25/0753* (2013.01); *H01L 2924/0002* (2013.01)

(58) Field of Classification Search
CPC ......... F21V 15/04; F21V 17/00; F21V 17/06; F21V 19/0035; F21V 19/003; F21V 19/00; F21V 19/001; F21V 19/0015; F21V 19/002; F21V 19/0055; F21S 8/04; F21Y 2101/02; F21Y 2105/001; H01L 25/0753; H01L 2924/00; H01L 2924/0002

See application file for complete search history.

(56) References Cited

U.S. PATENT DOCUMENTS 7,182,627 B1 * 2/2007 Huang ........................... 439/487
8,405,118 B2 * 3/2013 Chung et al. .................... 257/99

(Continued)

FOREIGN PATENT DOCUMENTS

| EP | 2124255 A1 | 11/2009 |
| EP | 2397745 A2 | 12/2011 |
| JP | 2004-265626 | 9/2004 |

OTHER PUBLICATIONS

Extended European Search Report for EP 13198347.0, dated Mar. 21, 2014.

*Primary Examiner* — Bao Q Truong
(74) *Attorney, Agent, or Firm* — Greenblum & Bernstein P.L.C.

(57) ABSTRACT

A lighting device pertaining to one aspect of the present invention includes a mount, a light-emitting module, and a substrate holder. The light-emitting module is mounted on a main surface of the mount, and the substrate holder covers a portion of the light-emitting module and is connected with the mount. The light-emitting module includes a substrate, a plurality of light-emitting elements, a sealant and a padding. The padding is provided on a first main surface of the substrate. The light-emitting module is mounted on the main surface of the mount such that a second main surface of the substrate comes into contact with the main surface of the mount, and the light-emitting module is fixed to the mount by pressure applied from the substrate holder via the padding brought into contact with the substrate holder. The padding is made of a same material as the sealant.

11 Claims, 10 Drawing Sheets

(51) Int. Cl.
  *F21S 8/04* (2006.01)
  *F21Y 101/02* (2006.01)
  *F21Y 105/00* (2006.01)
  *H01L 25/075* (2006.01)

(56) References Cited

U.S. PATENT DOCUMENTS

2006/0141851 A1    6/2006  Matsui et al.
2008/0043473 A1*   2/2008  Matsui .................... 362/294
2009/0290346 A1   11/2009  Ogawa et al.
2010/0046232 A1    2/2010  Matsui et al.
2010/0315823 A1   12/2010  Lin et al.
2011/0309379 A1   12/2011  Shibusawa et al.
2012/0224372 A1    9/2012  Ogawa et al.
2012/0230033 A1*   9/2012  Yoon et al. ................ 362/267
2012/0268929 A1*  10/2012  Chung et al. ............... 362/231
2013/0088867 A1    4/2013  Chung et al.

* cited by examiner

LIGHTING DEVICE AND LIGHT-EMITTING MODULE

TECHNICAL FIELD

The present invention relates to lighting devices and light-emitting modules.

BACKGROUND ART

Some sorts of lighting devices are provided with a light-emitting module having a substrate and a plurality of light-emitting elements mounted on the substrate. Such a lighting device is used under the condition that the light-emitting module is fixed to a mount such as a heat sink.

To fix the light-emitting module to the mount, one of the following structures may be adopted, for example:

(a) The substrate and the mount of the light-emitting module are fixed by screws.

(b) The light-emitting module is placed on the mount, and the substrate holder and the mount are fixed by screws, with the substrate holder covering the light-emitting module and the mount.

In the case of the structure in (b) above, the substrate of the light-emitting module sandwiched between the substrate holder and the mount is pressed against the mount by the force of the screws fastening the substrate holder and the mount to each other, and thus the substrate is fixed to the mount.

CITATION LIST

Patent Literature

[Patent Literature 1] Japanese Patent Application Publication No. 2004-265626

SUMMARY OF INVENTION

Technical Problem

The substrate of a light-emitting module would deflect before being fixed to the mount. It is considered that this is because of, for example, a heating process during the manufacturing of the light-emitting module and subsequent cooling. Examples of heating process include soldering for mounting the light-emitting elements on the substrate and sealing of the light-emitting elements with sealant. During such heating and cooling processes, the substrate deflects due to the difference in coefficient of thermal expansion between solder or sealant and the substrate.

When a light-emitting module with a substrate having a deflected section is fixed to a mount, the stress is gradually concentrated to the deflected section of the substrate while the substrate holder and the mount are being fastened to each other by screws. Therefore, if the substrate is deflected, it is likely that damage such as a crack occurs in the substrate when the light-emitting module is fastened to the mount.

Considering the use of a light-emitting module having a deflected substrate, it would be possible to avoid the occurrence of damage to the substrate during the fastening process by inserting a rubber or the like between the substrate holder and the substrate. However, insertion of another part like a rubber would require complicated work and parts control.

The present invention is made in view of the above-described problem, and aims to provide, without degrading the production efficiency, a lighting device and a light-emitting module having a substrate that is unlikely to be damaged during the fixing to the mount, regardless of whether or not there is deflection in the substrate.

Solution to Problem

A lighting device pertaining to one aspect of the present invention includes a mount, a light-emitting module, and a substrate holder. The light-emitting module is mounted on a main surface of the mount. The substrate holder covers a portion of the light-emitting module, and is connected with the mount.

Here, the light-emitting module includes: a substrate; a plurality of light-emitting elements; a sealant; and a padding. The plurality of light-emitting elements are mounted on a first main surface of the substrate. The sealant is mounted on the first main surface of the substrate, and seals the plurality of light-emitting elements. The padding is located on a first main surface of the substrate.

In the lighting device pertaining to this aspect, the light-emitting module is mounted on the main surface of the mount such that a second main surface of the substrate, which is opposite the first main surface, comes into contact with the main surface of the mount, and the light-emitting module is fixed to the mount by receiving pressure from the substrate holder via the padding brought into contact with a surface of the substrate holder, the surface facing toward the main surface of the mount. The padding is made of a same material as the sealant.

In the lighting device having the stated structure, in plan view of the light-emitting module, the padding may surround an area of the first main surface of the substrate, and the plurality of light-emitting elements may be mounted on the area surrounded by the padding.

In the lighting device having the stated structure, the padding may be composed of at least three padding portions separated from each other.

In the lighting device having the stated structure, in plan view of the light-emitting module, a center point of the plurality of light-emitting elements may be located within an area defined by three line segments connecting any three portions out of the padding portions with each other.

In the lighting device having the stated structure, the plurality of light-emitting elements may be grouped in rows, the sealant may be composed of a plurality of sealant portions separated from each other and sealing the rows in one-to-one correspondence, and each of the plurality of sealant portions may be connected with a longitudinal end of a different one of the padding portions.

In the lighting device having the stated structure, the padding may be connected with the sealant.

In the lighting device having the stated structure, the substrate holder may have a tapered hole provided above the plurality of light-emitting elements so as not to cover the plurality of light-emitting elements, the tapered hole may taper toward the light-emitting module, and a surface of a side wall of the tapered hole may be a reflective surface that reflects light from the plurality of light-emitting elements.

In the lighting device having the stated structure, under a condition that the light-emitting module is not receiving pressure from the substrate holder, a maximum height of the padding with reference to the first main surface of the substrate may be equal to or larger than a maximum amount of deflection in the substrate.

In the lighting device having the stated structure, under a condition that the light-emitting module is not receiving pressure from the substrate holder, the padding may have a smaller maximum height than the sealant with reference to the first main surface of the substrate.

In the lighting device having the stated structure, the substrate of the light-emitting module may be made of a ceramic containing material.

Another aspect of the present invention is a light-emitting module located between a mount and a substrate holder and fixed to the mount. The light-emitting module includes: a substrate; a plurality of light-emitting elements; a sealant; and a padding. The plurality of light-emitting elements are mounted on a first main surface of the substrate. The sealant is mounted on the first main surface of the substrate, and seals the plurality of light-emitting elements. The padding is located on a first main surface of the substrate.

In the light-emitting module pertaining to this aspect, the light-emitting module is mounted on a main surface of the mount such that a second main surface of the substrate, which is on the opposite side of the substrate as the first main surface, comes into contact with the main surface of the mount, and the light-emitting module is fixed to the mount by pressure applied from the substrate holder via the padding brought into contact with a surface of the substrate holder, the surface facing toward the main surface of the mount. The padding is made of a same material as the sealant.

Advantageous Effects of Invention

In the lighting device pertaining to the aspect described above, the padding disposed on the substrate of the light-emitting module comes in contact with the substrate holder when the light-emitting module is fixed to the mount. Since the padding is located on the first main surface of the substrate of the light-emitting module, the amount of the pressure that the substrate receives from the substrate holder is reduced compared to conventional structures. That is, deformation (elastic deformation or plastic deformation) of the padding reduces the stress applied to the substrate. Therefore, in the lighting device described above, it is unlikely that damage such as a crack occurs in the substrate regardless of whether there is deflection in the substrate or not.

Furthermore, since the padding of the lighting device described above is made of the same material as the sealant, the padding and the sealant can be continuously formed without changing the material at the switching between the process of forming the padding and the process of forming the sealant. Therefore, the lighting device can be still manufactured at high production efficiency.

The light-emitting module pertaining to the aspect described above is provided with a padding located on the first main surface of the substrate. Therefore, when the light-emitting module is fastened to the mount, it is unlikely that damage such as a crack occurs in the substrate regardless of whether there is deflection in the substrate or not, for the same reasons as described above.

Furthermore, since the padding of the light-emitting module described above is also made of the same material as the sealant, the light-emitting module can be still manufactured at high production efficiency.

DESCRIPTION OF EMBODIMENTS

The following describes a lighting device and a light-emitting module pertaining to Embodiments of the present invention with reference to the drawings. Note that each of the following embodiments is a preferable example of the present invention. Therefore, numeric values, shapes, materials, constitutional elements, and the arrangement and connection configuration of the constitutional elements are merely examples and do not limit the present invention. For this reason, the components of the following embodiments, except for essential part of the present invention, may be modified according to needs.

Furthermore, the drawings attached hereto are schematic diagrams, and their sizes and shapes are not depicted to scale.

Embodiment 1

Components

Figure 1:
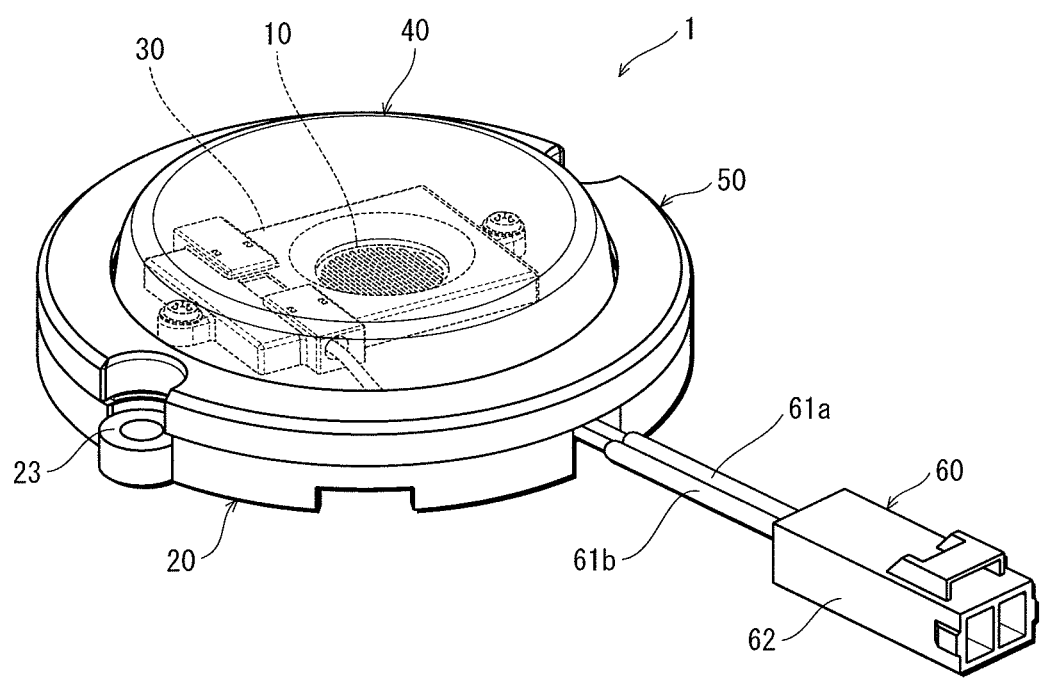
FIG. 1 is a schematic perspective view of a lighting device pertaining to Embodiment 1.
Figure 1:
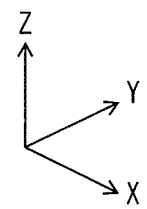
Figure 2:
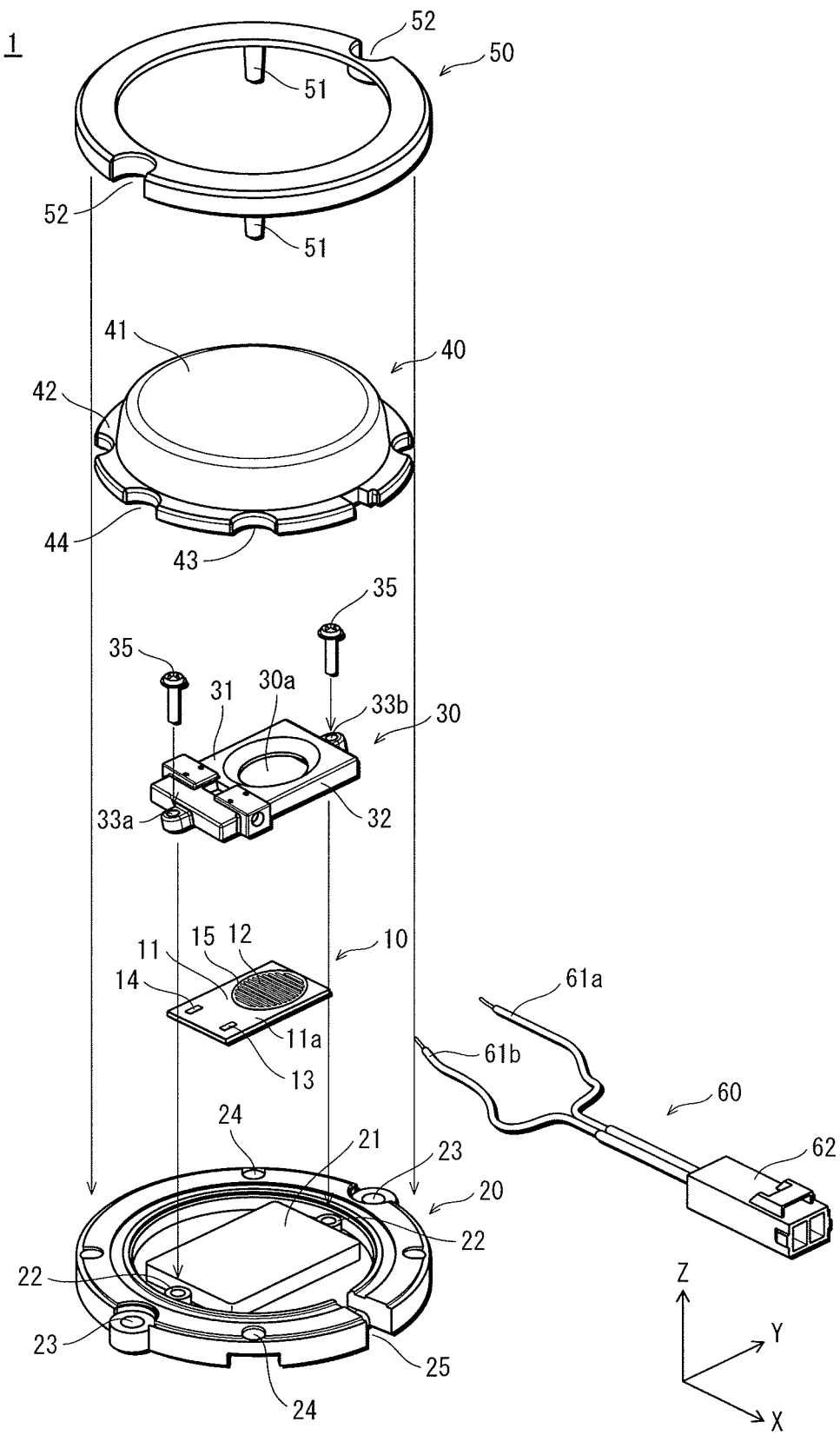
FIG. 2 is a schematic exploded perspective view of the lighting device pertaining to Embodiment 1.

The following describes a lighting device 1 pertaining to the present embodiment with reference to FIG. 1 and FIG. 2. In the following, it is assumed that the positive direction and the negative direction of the Z axis shown in the drawings respectively correspond to the upside and the downside of the lighting device 1.

As shown in FIG. 1 and FIG. 2, the lighting device 1 includes: a light-emitting module 10; a mount 20 on which the light-emitting module 10 is mounted; a substrate holder 30 fixing the light-emitting module 10 to the mount 20; a cover 40 covering the light-emitting module 10, the mount 20 and the substrate holder 30; a cover brace 50; and a wiring part 60.

Light-Emitting Module 10

The light-emitting module 10 is provided as a light source of the lighting device 1. As shown in FIG. 2, the light-emitting module 10 includes: a substrate 11; a light-emitter 12 disposed on a first main surface 11a of the substrate 1; connectors 13 and 14 disposed on the first main surface 11a of the substrate 11; and a padding 15. The following explains each component in detail with reference to FIG. 3A and FIG. 3B.

Substrate 11

Figure 3A:
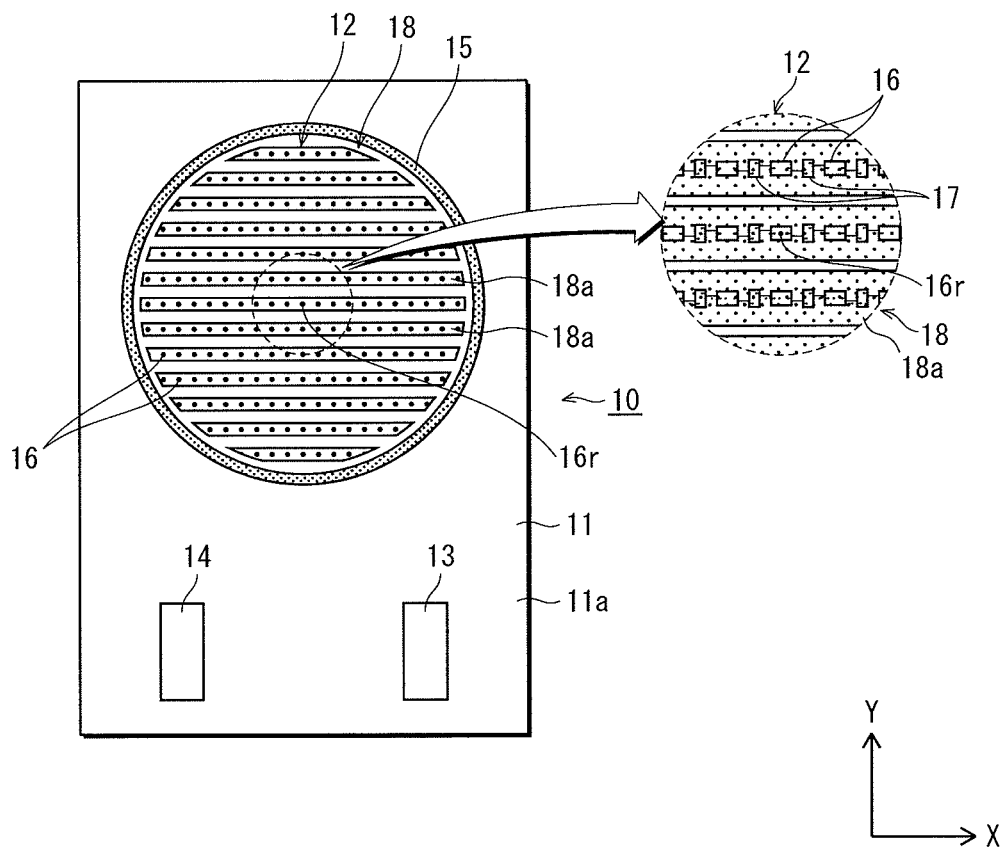
FIG. 3A is a schematic plan view of a substrate 11 of a light-emitting module 10.

As shown in FIG. 3A, the substrate 11 in plan view has a rectangular shape with a length of 25 mm, a width of 20 mm and a thickness of 1 mm, for example.

The substrate 11 is made of material containing an insulating material such as ceramic or thermal conductive resin. Note, however, that the material of the substrate 11 is not limited to the above. For example, the substrate 11 may be composed of a single layer of insulating material, or two layers, namely a metal layer and an insulating layer. The metal layer may be made of a metal such as aluminum or an alloy of the metal.

Light-Emitter 12

As shown in the enlarged portion of FIG. 3A, the light-emitter 12 includes: a plurality of light-emitting elements 16 mounted on the first main surface 11a of the substrate 11; and a sealant 18 covering and sealing the light-emitting elements 16.

In plan view, the light-emitting elements 16 are arranged along X and Y directions in a matrix. More specifically, the light-emitting elements 16 are grouped in a plurality of columns each extending in the Y axis direction, and the columns are arranged in the X direction. The light-emitting elements 16 of the light-emitting module 10 are symmetrical with respect to the center point 16r of the plurality of the light-emitting elements 16.

Note that in the descriptions of embodiments, the "center point" of a plurality of light-emitting elements mounted on the main surface of the substrate refers to a point that is indicated by arithmetic mean of the coordinates of all the light-emitting elements in plan view.

As shown in the enlarged portion of FIG. 3A, lands 17 for wire bonding are disposed to be adjacent to each light-emitting element 16. The light-emitting elements 16 and the lands 17 are electrically connected via a wire.

Each light-emitting element 16 is a GaN light-emitting diode (LED) which emits blue light having a peak wavelength within the range of 430 nm to 480 nm. Each light-emitting element 16 is mounted on the first main surface 11a of the substrate 11 by, for example, a chip on board (COB) technology.

As shown in FIG. 3A, the sealant 18 is composed of a plurality of portions (sealant portions 18a), which are separated from each other in the Y axis direction. Each sealant portion 18a has an elongated shape in the X axis direction. That is, each sealant portion 18a seals one of the rows of the light-emitting elements 16 arranged in the X axis direction. The size of each sealant portion 18a may be determined according to the number and the shapes of the light-emitting elements 16 to be mounted.

The sealant 18 is made of light-transmissive material containing a wavelength converter, and converts a portion of the light emitted from each light-emitting element 16 to light having a different wavelength. For example, a portion of the light emitted from each light-emitting element 16 is converted to light having a peak wavelength within the range of approximately 530 nm to approximately 650 nm. Consequently, the light after the conversion and the blue light before the conversion are mixed, and the light-emitter 12 emits white light.

The sealant 18 is made of light-transmissive material such as silicone resin, fluorine resin, hybrid resin of silicone resin and epoxy resin, or urea resin. The light-transmissive material contains, for example, phosphor particles severing as the wavelength convertor.

Padding 15

As shown in FIG. 3A, the padding 15 has an annular shape in plan view. The light-emitting elements 16 are arranged in an area surrounded by the padding 15 disposed on the first main surface 11a of the substrate 11. Therefore, the center point 16r of the light-emitting elements 16 is also located within the area surrounded by the padding 15.

The padding 15 is made of the same material as the sealant 18. That is, as with the sealant 18, the padding 15 of the present embodiment is made of a light-transmissive material containing a wavelength converter. Note that the light-transmissive material contained in the sealant 18 and the padding 15 has a larger elasticity coefficient than at least the material of the substrate 11.

Figure 3B:
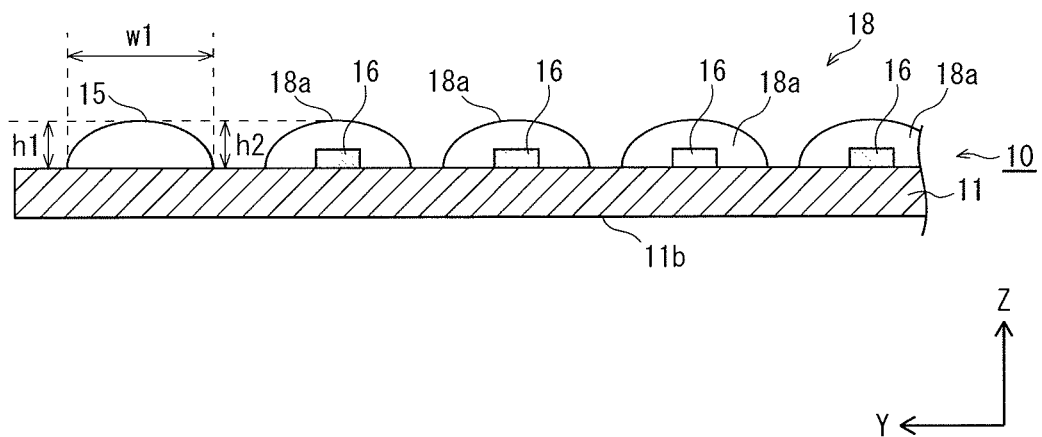
FIG. 3B is a schematic partial cross-sectional view showing part of the light-emitting module 10.

As shown in FIG. 3B, the cross section of the padding 15 has a shape of semicircle or semi-ellipse. Considering the function of buffering as described below, it is desirable that the width w1 of the cross section of the padding 15 is as long as possible within the limitation of the size of the light-emitting module 10. Similarly, considering the function of buffering as described below, it is also desirable that the height h1 of the cross section of the padding 15 is smaller than the height h2 of the sealant 18. This is for preventing the light emitted by the light-emitter 12 from entering the gap in the height direction between the substrate holder 30 and the substrate 11. The width w1 and the height h1 are specifically within the range of 0.5 mm to 1.5 mm and within the range of 0.2 mm to 0.5 mm, respectively. However, the width w1 and the height h1 may be changed according to, for example, the amount of pressure from the substrate holder 30 and the size of the first main surface 11a of the substrate 11.

The padding 15 and the sealant 18 are formed on the first main surface 11a of the substrate 11 by, for example, applying their material using a known dispenser and drying the material. The height h1 of the padding 15 and the height h2 of the sealant 18 are adjusted by controlling the amount of the material dispensed from the nozzle. Considering the efficiency in forming the padding 15 and the sealant 18, it is desired to keep the height of the nozzle unchanged. For this reason, the height h1 of the padding 15 and the height h2 of the sealant 18 in the present embodiment are set to the same.

Connectors 13 and 14

As shown in FIG. 3A, the connectors 13 and 14 are formed in a lower area, in the Y axis direction, of the first main surface 11a of the substrate 11. The connectors 13 and 14 supply each light-emitting element 16 with power. Although not depicted in the drawing, wires formed on the first main surface 11a of the substrate 11 connects the connectors 13 and 14 with each light-emitting element 16.

Mount 20

Returning to FIG. 2, the mount 20 is made by aluminum die casting, and has a circular outline in plan view. The mount 20 has a mounting part 21 for mounting the light-emitting module 10 thereon. The mounting part 21 is provided in the central area of the top surface of the mount 20, and servers as a heat sink for releasing heat from the light-emitting module 10.

On the top surface of the mount 20, screw holes 22 are provided so as to sandwich the mounting part 21 from both sides in the Y axis direction. When joining the substrate holder 30 to the mount 20 with the light-emitting module 10 between them, assembly screws 35 are threaded into the screw holes 22.

Also, insertion holes 23, boss holes 24, and a cutout 25 are provided in the periphery of the mount 20.

Substrate Holder 30

As shown in FIG. 2, the substrate holder 30 is joined to the mount 20 with the assembly screws 35 threaded into the screw holes 22 of the mount 20. The light-emitting module 10 is fixed to the mounting part 21 of the mount 20 with the first main surface 11a thereof being pressed toward the mount 20 by the substrate holder 30.

The substrate holder 30 is formed by injection molding of resin such as polybutylene terephthalate (PBT) with which a white pigment is mixed. The substrate holder 30 has a length of 35 mm, a width of 25 mm and a thickness of 4 mm, for example.

Figure 4A:
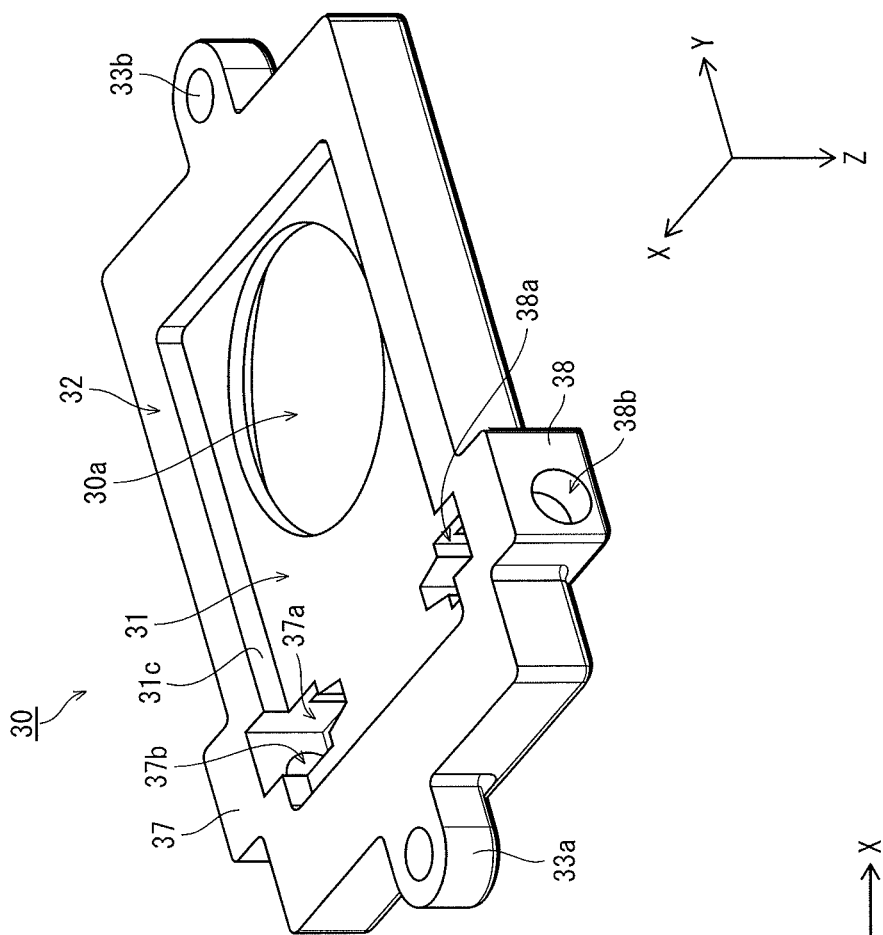
FIG. 4A is a schematic top view of a substrate holder 30.
Figure 4B:
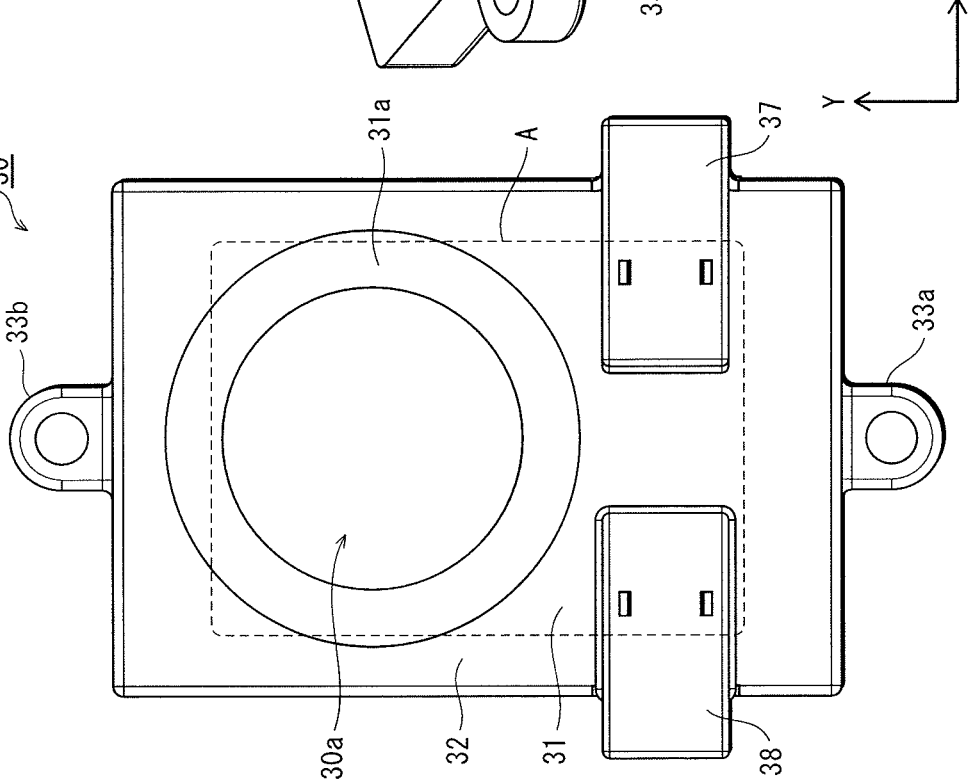
FIG. 4B is a schematic perspective view of a substrate holder 30 from the bottom.

The following describes the structure of the substrate holder 30 in detail with reference to FIGS. 4A and 4B.

As shown in FIGS. 4A and 4B, the substrate holder 30 is formed from a thin covering 31 and a thick wall 32 around it, which are integrated in one piece.

On the upper surface of the substrate holder 30, the covering 31 and the wall 32 are flush with each other as shown in FIG. 4A. On the other hand, on the lower surface of the substrate holder 30, a concave portion 31c is formed by the covering 31 and the wall 32 surrounding the covering 31 as shown in FIG. 4B. The light-emitting module 10 is to be housed within the concave portion 31c of the substrate holder 30.

Here, the dashed line A shown in FIG. 4A represents the boundary between the covering 31 and the wall 32. When the light-emitting module 10 is housed within the substrate holder 30, the outer edge of the light-emitting module 10 coincides with the dashed line A.

The depth of the concave portion 31c is equal to, or approximately 0.2 mm smaller than, the addition of the thickness of the substrate 11 and the height of the padding 15.

The wall 32 of the substrate holder 30 has screw attaching portions 33a and 33b, which protrude in the Y axis direction and correspond in position to the screw holes 22 of the mount 20. Each of the screw attaching portions 33a and 33b has an insertion hole. The assembly screws 35 are inserted through the insertion holes of the screw attaching portions 33a and 33b and are threaded into the screw holes 22 of the mount 20.

Figure 5:
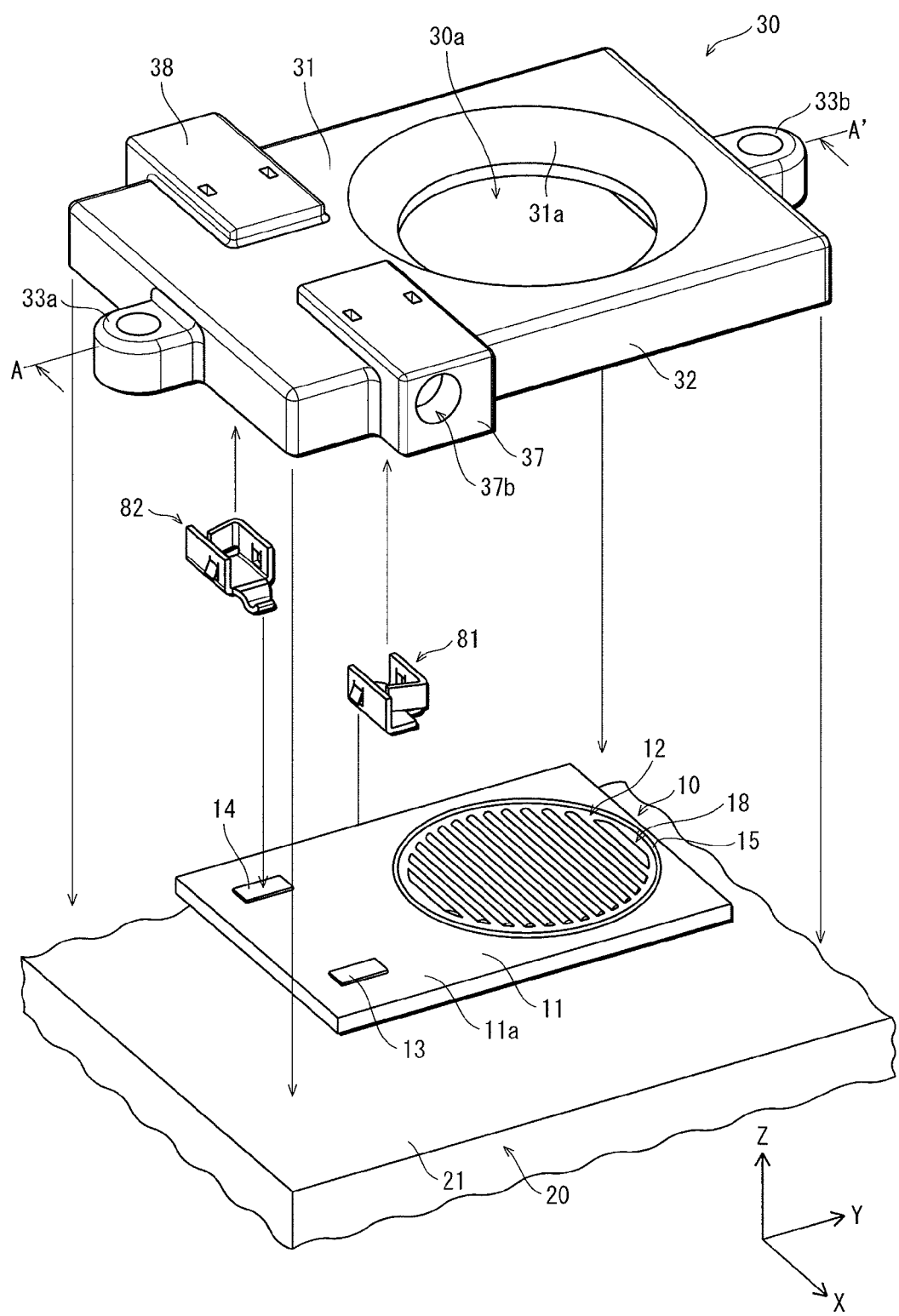
FIG. 5 is a schematic perspective view showing the light-emitting module 10 and the substrate holder 30.

As shown in FIG. 5, the covering 31 of the substrate holder 30 has a window 30a, which is to be located above the light-emitter 12 of the light-emitting module 10 in the Z axis direction. The side wall 31a defining the window 30a is inclined with respect to the Z axis direction. That is, the window 30a is a tapered hole that tapers from bottom to top along the Z axis direction.

The surface of the side wall 31a defining the window 30a is a reflective surface. The reflective surface of the side wall 31a reflects off a portion of light from the light-emitter 12 upward.

As shown in FIG. 5, a pair of joint connectors 37 and 38 are provided at both sides in the X axis direction of the substrate holder 30. The joint connectors 37 and 38 are used for connecting lead wires 71a and 71b to the connectors 14 and 15 of the light-emitting module 10. The joint connectors 37 and 38 respectively have concave portions 37a and 38a at their bottom surfaces, and also have through holes 37b and 38b communicating with the concave portions 37a and 38a.

Cover 40

Returning to FIG. 2, the cover 40 includes: a main body 41 serving as a lens; and a rim 42 extending outward from the periphery of the main body 41. The cover 40 is shaped like a dome. The cover 40 is fixed to the mount 20 so as to cover the light-emitting module 10 and the substrate holder 30. The light from the light-emitter 12 of the light-emitting module 10 passes through the cover 40 and travels out of the lighting device 1.

The cover 40 is made of light-transmissive material. Examples of the light-transmissive material for the cover 40 include silicone resin, acrylic resin and glass.

Cover Brace 50

As shown in FIG. 2, the cover brace 50 has an annular plate-like shape. The cover brace 50 has an annular shape in order not to block the light passing through the cover 40.

The cover brace 50 is made, for example, of metal such as aluminum, or non-light-transmissive resin.

The cover brace 50 has two bosses 51 on the lower surface in the Z axis direction. When the lighting device is assembled, the bosses 51 pass through the spaces defined by cutout edges 43 of the cover 40, and are inserted into the boss holes 24. The tips of the bosses 43 are thus fixed to the mount 20. The rim 42 of the cover 40 is fastened by being sandwiched between the cover brace 50 and the mount 20.

The cover brace 50 and the rim 42 of the cover 40 respectively have cutouts 52 and cutouts 44 corresponding in position to the insertion holes 23 of the mount 20. This structure prevents attachment screws (not depicted in the drawing) to be inserted into the insertion holes 23 from touching the cover brace 50 and the cover 40.

Wiring Part 60

As shown in FIG. 2, the wiring part 60 includes: a pair of lead wires 61a and 61b; and a connector 62 attached to one end of the pair.

One end of the lead wire 61a and one end of the lead wire 61b are inserted into joint connectors 81 and 82 (See FIG. 5) housed within the concave portions 37a and 38a of the substrate holder 30 via the through holes 37b and 38b. Thus, the lead wires 61a and 61b are electrically connected to the connectors 13 and 14 of the light-emitting module 10 via the joint connectors 81 and 82, respectively. The connector 62 is electrically connected to an external commercial power source and receives power from the power source.

<Procedures for Fixing Light-emitting Module 10 to Mount 20 by Using Substrate Holder 30>

Figure 6A:
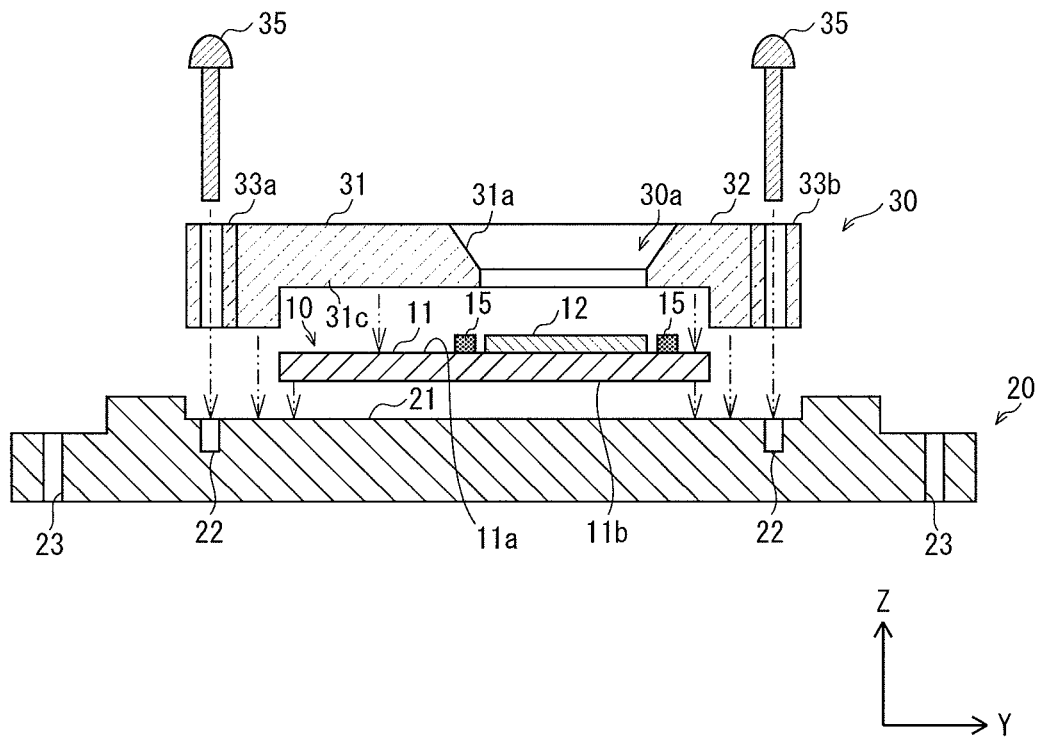
FIG. 6A is a cross-sectional view along A-A' line in FIG. 5, and schematically illustrates the process of fixing the light-emitting module 10 to a mount 20 by using the substrate holder 30.
Figure 6B:
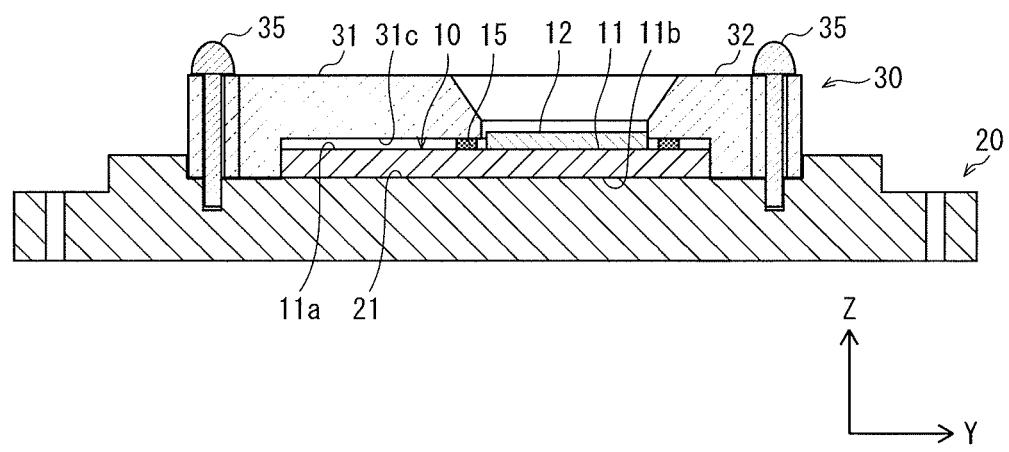
FIG. 6B is a cross-sectional view along the A-A' line in FIG. 5, and schematically illustrates the light-emitting module 10 fixed to the mount 20 by the substrate holder 30.

With reference to FIG. 5 and FIGS. 6A and 6B, the following explains the procedures for fixing the light-emitting module 10 to the mount 20 by using the substrate holder 30.

First, as shown in FIG. 5 and FIG. 6A, the light-emitting module 10 is positioned such that a second main surface 11b of the substrate 11 of the light-emitting module 10 faces the mounting part 21, and then the light-emitting module 10 is placed on the mounting part 21 of the mount 20. Subsequently, the substrate holder 30 is placed over the light-emitting module 10 such that the upper surface of the light-emitter 12 exposed from the window 30a. In this step, the light-emitting module 10 is positioned to be embedded within the concave portion 31c as shown in FIG. 6A.

Next, the assembly screws 35 are inserted into the through holes of the screw attaching portions 33a and 33b of the substrate holder 30, and are threaded into the screw holes 22 of the mount 20. Consequently, as shown in FIG. 6B, the light-emitting module 10 is fixed to the mount 20 with the first main surface 11a of the substrate 11 receiving pressure from the substrate holder 30 via the padding 15.

Simultaneously, the joint connectors 81 and 82 are embedded into the joint connectors 37 and 38 while the substrate holder 30 is being embedded into the light-emitting module 10 as shown in FIG. 5.

<Function of Padding 15>

In the lighting device pertaining to the present embodiment, the padding 15 is provided on the first main surface 11a of the substrate 11 of the light-emitting module 10. As shown in FIG. 6B, when the light-emitting module 10 is fastened to the mount 20 by the pressure from the substrate holder 30, the padding 15 is brought into contact with the lower surface, in the Z axis direction, of the substrate holder 30 (the surface facing the main surface of the mount 20).

For the sake of simplicity, the substrate 11 of the light-emitting module 10 depicted in FIG. 6A for example has a flat shape even though the substrate 11 is not receiving pressure from the substrate holder 30.

However, the substrate 11 would deflect due to the heating process during the manufacturing of the light-emitting module and subsequent cooling. Here, the expression "the substrate deflects" means that the substrate 11 deflects in the thickness direction of the substrate 11 under the condition that the light-emitting elements 16 have been mounted on the first main surface 11a of the substrate 11 and the first main surface 11a of the substrate 11 has not been pressed by the substrate holder 30.

As described above, in the lighting device pertaining to the present embodiment, when the first main surface 11a of the substrate 11 is pressed by the substrate holder 30, the padding 15 is inserted between the first main surface 11a of the substrate 11 and the substrate holder 30. Therefore, even when the substrate 11 deflects, the stress occurring in the deflected section of the substrate 11 due to the pressure from the substrate holder 30 is reduced in a preferable manner by the elastic deformation (or plastic deformation) of the padding 15.

In the description above, it is stated that the height h1 of the padding 15 in the cross section (See FIG. 3B) is preferably equal to or greater than the maximum amount of deflection, and the width w1 preferably is as long as possible. This is for enabling the padding 15, which is elastically deformable (or plastically deformable), to prevent the substrate 11 from being damaged.

Note that "the maximum amount of deflection" of the substrate 11 is the maximum value among the values obtained by measuring the deflection in the substrate by a known particular method for measuring the amount of deflection. Also note that each of "the height" of the padding and "the height" of the sealant refers to the maximum height Ry according to the Japanese industrial standards (JIS), measured from the main surface of the substrate.

Furthermore, in the present embodiment, the padding 15 and the sealant 18 are formed with a gap between them, as shown in FIG. 3A and FIG. 3B. Due to the gap between the padding 15 and the sealant 18, the deformation of the padding 15 caused by the pressure from the substrate holder 30 does not affect the sealant 18. This prevents deformation of the sealant 18, which can be a cause of disconnection of wires for example.

Next, the possibility should be considered that in the process of embedding the lower portion of the substrate holder 30 into the light-emitting module 10, excessive pressure would be applied to the first main surface 11a of the substrate 11, depending on the depth of the embedding.

However, as shown in FIG. 6A, the padding 15 is provided on the first main surface 11a of the substrate 11. Therefore, even when the concave portion 31c in the lower surface of the substrate holder 30 is embedded relatively deep in the light-emitting module 10, the stress to the deflected section of the substrate 11 caused by the pressure from the substrate holder 30 is reduced by the elastic deformation (or plastic deformation) of the padding 15.

Also, in the process of embedding the light-emitting module 10 into the concave portion 31c of the substrate holder 30, the padding 15 prevents the bottom surface of the concave portion 31c and the first main surface 11a from being in contact with each other, and hence the substrate 11 is prevented from being damaged by an external impact.

Furthermore, it should be considered that when the application screws 35 are threaded into the screw holes 22, a relatively high pressure is applied toward the first main surface 11a of the substrate 11. The present embodiment addresses this phenomenon as well. Since the padding 15 is provided on the first main surface 11a of the substrate 11, the stress occurring in the deflected section of the substrate 11 is reduced by the elastic deformation (or plastic deformation) of the padding 15. Thus, it is unlikely that damage such as a crack occurs in the substrate 11.

In addition, the padding 15 has an annular shape in plan view, and surrounds all the light-emitting elements 16 included in the light-emitter 12 (See FIG. 3A). Therefore, when the substrate holder 30 presses the first main surface 11a of the substrate 11, a uniform pressure is applied to the area surrounded by the padding 15, and this pressure increases the joint strength between the substrate 11 and the mounting part 21, particularly on the contact area corresponding in position to the area surrounded by the padding 15. Consequently, the padding improves the efficiency of the conductance of heat from each of the light-emitting elements 16 to the mounting part 21.

<Summary>

As described above, the lighting device 1 pertaining to the present embodiment has the padding 15 provided on the main surface 11a of the substrate 11, and therefore damage to the substrate 11 is reduced (i.e. the occurrence of damage is prevented) regardless of whether there is deflection in the substrate 11 or not. That is, the elastic deformation (or the plastic deformation) of the padding 15 reduces the stress to the substrate 11 caused by the pressure from the substrate holder 30.

Also, according to the present embodiment, the padding 15 and the sealant 18 are made of a same material. Therefore, it is unnecessary to change the material at the switching between the process of forming the padding 15 and the process of forming the sealant 18. This allows for continuous forming of the padding 15 and the sealant 18, and maintains the high production efficiency despite the addition of the padding 15.

In the lighting device 1 pertaining to the present embodiment, the padding 15 has an annular shape in plan view and surrounds all the light-emitting elements included in the light-emitter 12. Therefore, when the first main surface 11a of the substrate 11 is pressed by the substrate holder 30, a uniform pressure is applied to the area surrounded by the padding 15. Therefore, the stated structure increases the joint strength between the substrate 11 and the mounting part 21, particularly on the contact area corresponding in position to the area surrounded by the padding 15, and improves the efficiency of the conductance of heat from each of the light-emitting elements 16 to the mounting part 21.

Furthermore, in the lighting device 1 pertaining to the present embodiment, the substrate holder 30 has the window 30a which is a tapered hole. The surface of the side wall 31a defining the window 30a has a reflective surface, and a portion of light from each of the light-emitting elements 16 is reflected by the side wall 31a and travels outward from the device. Therefore, the lighting device 1 pertaining to the present embodiment achieves a high efficiency in outputting light.

Also, in the lighting device 1 pertaining to the present embodiment, the maximum height of the padding 15 measured from the first main surface 11a of the substrate 11 may be set equal to or greater than the maximum amount of deflection in the substrate 11. The amount of deflection in the substrate 11 depends on the material and the shape of the substrate 11, but generally the amount of deflection increases as the distance from the center point of the substrate 11 increases, and the amount of deflection at the edge of the substrate 11 is greater than in the central area. Therefore, the stated structure, with which the padding 15 elastically (or plastically) deforms in the height direction by a sufficient amount, reduces the amount of displacement of the deflected section in the thickness direction of the substrate 11.

Also, in the lighting device 1 pertaining to the present embodiment, the maximum height of the padding 15 measured from the first main surface 11a of the substrate 11 may be set smaller than the maximum height of the sealant 18 measured from the first main surface 11a of the substrate 11. This structure reduces the proportion of the light entering the gap in the height direction between the substrate holder 30 and the substrate 11 with respect to the light emitted by the light-emitter 12.

Also, in the lighting device 1 pertaining to the present embodiment, the substrate 11 may be made of a ceramic containing material. When the substrate containing ceramic is used, the substrate would deflect before manufacturing of the light-emitting module 10. Even if this is the case, the padding 15 provided in the present embodiment prevents damage to the substrate, and brings the benefits of the use of ceramic.

Embodiment 2

The following describes a downlight to explain an example application in which the lighting device 1 pertaining to Embodiment 1 described above is installed in a light fixture.

Figure 7:
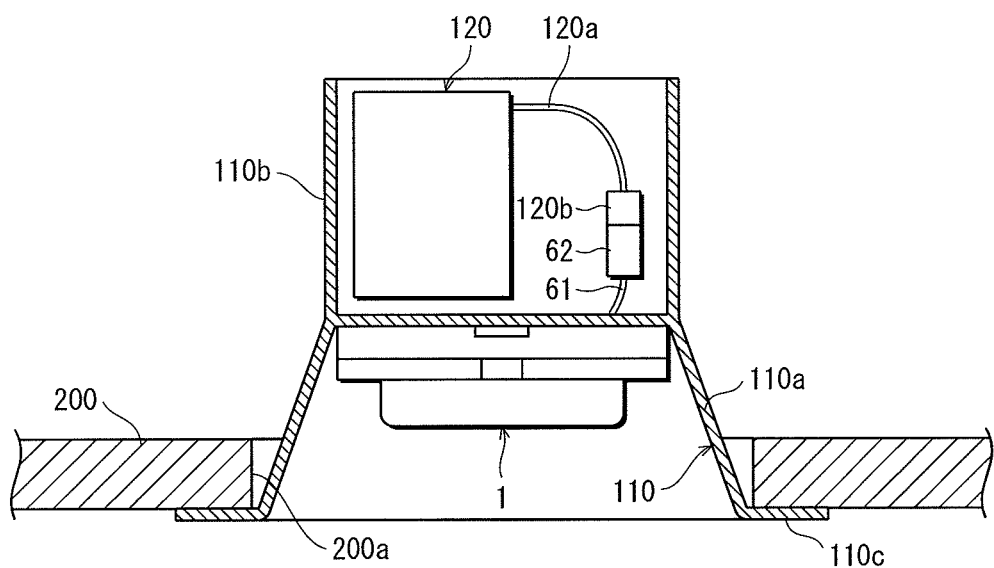
FIG. 7 is a schematic cross-sectional view showing a downlight 100 having a lighting device pertaining to Embodiment 2.

As shown in FIG. 7, a downlight 100 pertaining to the present embodiment includes: the lighting device 1 pertaining to Embodiment 1 described above; a light fixture 110; and a circuit unit 120.

The light fixture 110 is made of metal and is composed of a light source housing 110a, a circuit housing 110b and a rim 110c. Among these components, the light source housing 110a has a cylindrical shape with a bottom. The lighting device 1 is detachably attached to the inside of the light source housing 110a. The circuit housing 110b is extended from the bottom of the light source housing 110a, and houses the circuit unit 120. The rim 110c has an annular shape in plan view, and extends outward from the opening of the light source housing 110a.

The light fixture 110 is to be attached to a ceiling 200, with the light source housing 110a and the circuit housing 110b being in contact with the side wall defining a hole 200a for embedding provided in the ceiling 200.

The circuit unit 120 has a built-in circuit which is electrically connected to an external commercial power source and lights up the lighting device 1. The circuit unit 120 has a power source line 120a for electrically connecting to the lighting device 1. A connector 120b is provided at the tip of the power source line 120a. The connector 120b is detachable and is to be connected to the connector 62 of the wiring part 60 of the lighting device 1.

In the downlight 100 pertaining to the present embodiment, the lighting device 1 and the circuit unit 120 are formed as separate units. However, a circuit that is equivalent to the circuit unit 120 may be included in the lighting device 1.

Modification 1

Figure 8A:
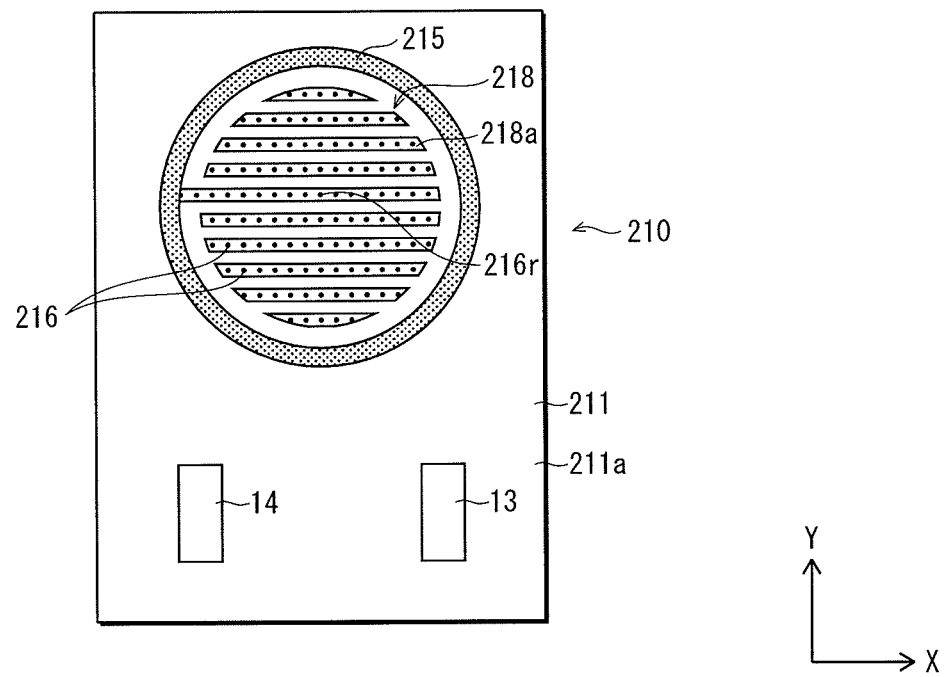
FIG. 8A is a schematic plan view of a light-emitting module 210 pertaining to Modification 1.

The following describes a lighting device pertaining to Modification 1 with reference to FIG. 8A. FIG. 8A is a schematic plan view showing the structure of a light-emitting module 210 provided in the lighting device pertaining to the present modification. The other components are the same as those of Embodiment 1, and therefore they are not illustrated and their explanations are omitted.

As shown in FIG. 8A, the light-emitting module 210 pertaining to the present modification includes mainly: a substrate 211; a plurality of light-emitting elements 216; a sealant 218; and a padding 215. The substrate 211 has connectors 13 and 14 on its first main surface 211a.

Also in the present modification, the sealant 218 is composed of a plurality of sealant portions 218a, which are separated from each other in the Y axis direction. In the present modification, however, one of the sealant portions 218a located at the center in the Y axis direction (i.e. the sealant portion 218a extending across the center point of the light-emitting elements 216) is connected to the padding 215 at one end of the sealant portion 218a in the longitudinal direction. Except for the above, the light-emitting module 210 has the same structure as the light-emitting module shown in FIG. 3A.

In this modification, the padding 215 and one of the sealant portions 218a constituting the sealant 218 are connected. Therefore, the sealant 218 can be formed by continuously ejecting and applying the material from the nozzle of the dispenser, and hence the sealant 218 and the padding 215 can be formed efficiently.

The present modification achieves the same advantageous effects as the light-emitting module 10 pertaining to Embodiment 1. In addition, the present modification is further improved in production efficiency.

Modification 2

Figure 8B:
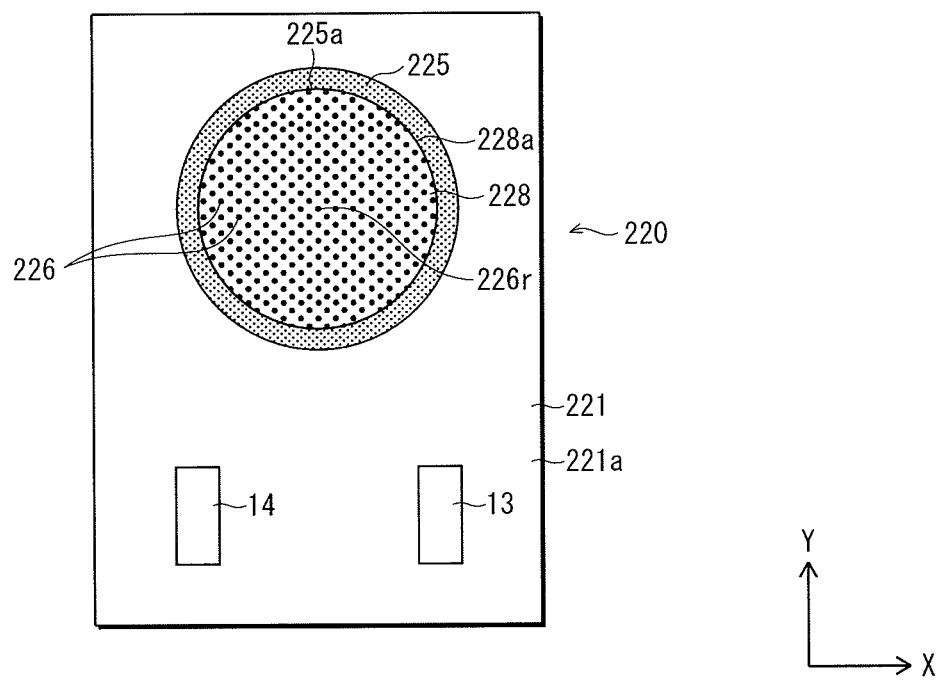
FIG. 8B is a schematic plan view of a light-emitting module 220 pertaining to Modification 2.

The following describes a lighting device pertaining to Modification 2 with reference to FIG. 8B. FIG. 8B is a schematic plan view showing the structure of a light-emitting module 220 provided in the lighting device pertaining to the present modification. The other components are the same as those of Embodiment 1, and therefore they are not illustrated and their explanations are omitted.

As shown in FIG. 8B, the light-emitting module 220 pertaining to the present modification includes mainly: a substrate 221; a plurality of light-emitting elements 226; a sealant 228; and a padding 225. The substrate 221 has connectors 13 and 14 on its first main surface 221a.

In the present modification, the sealant 228 is formed to cover all the light-emitting elements 226 mounted on the first main surface 221a of the substrate 221. The sealant 228 has an annular shape in plan view, and the center point thereof coincides with the center point 226r of the plurality of light-emitting elements 226.

In the present modification, an outer peripheral edge 228a of the sealant 228 is in contact with an inner peripheral edge 225a of the padding 225 having an annular shape. Therefore, in the manufacturing of the light-emitting module 220 pertaining to the present modification, the padding 225 and the sealant 228 can be formed more efficiently.

In Modification 1 shown in FIG. 8A and Modification 2 shown in FIG. 8B, the paddings 215 and 225 are respectively connected to the sealants 218 and 228. Since the padding and the sealant are made of the same material, there is a problem that it would be difficult to distinguish them from each other. Therefore, Description of the present application focuses on the function of the padding, and in the integrated body composed of the padding and the sealant, a portion pressed by the substrate holder is identified as the padding.

Modification 3

Figure 9A:
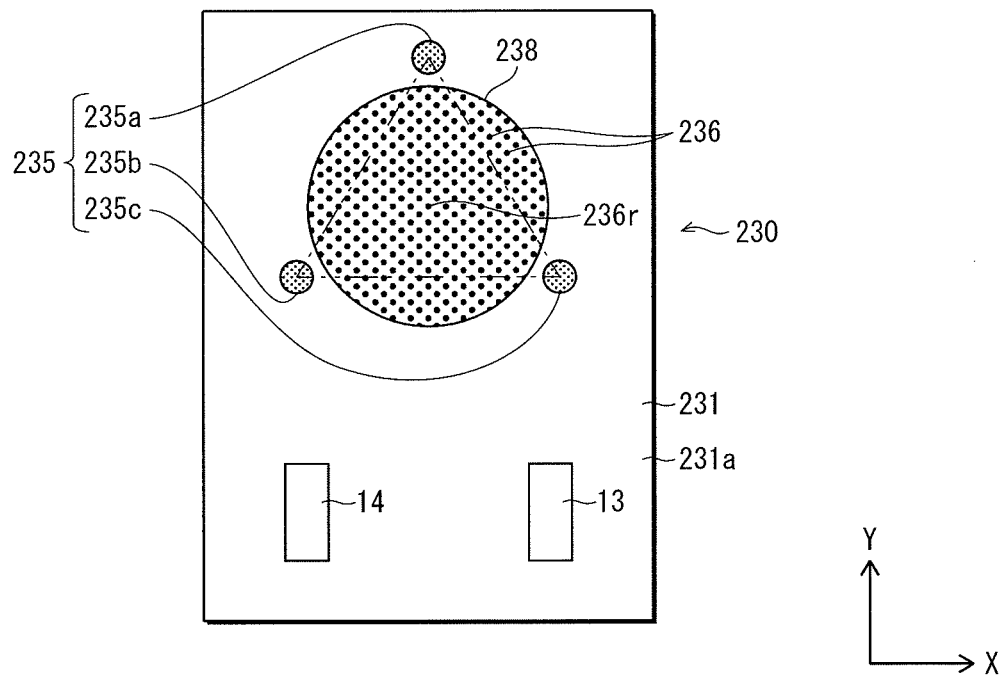
FIG. 9A is a schematic plan view of a light-emitting module 230 pertaining to Modification 3.

The following describes a lighting device pertaining to Modification 3 with reference to FIG. 9A. FIG. 9A is a schematic plan view showing the structure of a light-emitting module 230 provided in the lighting device pertaining to the present modification. The other components are the same as those of Embodiment 1, and therefore they are not illustrated and their explanations are omitted.

As shown in FIG. 9A, the light-emitting module 230 pertaining to the present modification includes mainly: a substrate 231; a plurality of light-emitting elements 236; a sealant 238; and a padding 235. The substrate 231 has connectors 13 and 14 on its first main surface 231a.

In the light-emitting module 230 pertaining to the present modification, as with Modification 2 described above, the sealant 238 is formed to cover all the light-emitting elements 236 mounted on the first main surface 231a of the substrate 231. The sealant 238 has an annular shape in plan view, and the center point thereof coincides with the center point 236r of the plurality of light-emitting elements 236.

The present modification is different from Modification 2 above in that the padding 235 is composed of three island-like padding portions 235a, 235b and 235c that are separated from each other.

The three padding portions 235a, 235b and 235c constituting the padding 235 are dispersed in the peripheral area surrounding the area where the plurality of light-emitting elements 236 are mounted. The padding portions 235a, 235b and 235c have the same height, and a virtual plane passing through their respective peaks is in parallel with the first main surface 231a of the substrate 231. Therefore, also in the present modification, the substrate holder 30 applies a uniform pressure to the first main surface 231a of the substrate 231 via the padding portions 235a, 235b and 235c constituting the padding 235. The structure of the present modification also increases the joint strength between the substrate 231 and the mounting part of the mount (See FIG. 2).

Furthermore, the stated structure reduces the manufacturing cost related to the padding 235 when compared with Embodiment 1 and Modifications 1 and 2, depending on the size and the number of the padding portions of the padding 235.

Also, as shown in FIG. 9A, line segments connecting the three padding portions 235a, 235b and 235c virtually form a triangle (depicted in two-dotted line in the drawing). The center point 236r of the plurality of light-emitting elements 236 is located inside the triangle. Therefore, the present modification increases the joint strength between the substrate 231 and the mounting part of the mount, particularly on the contact area corresponding to the area where the sealant 238 is disposed. This structure efficiently conducts the heat generated by the plurality of light-emitting elements 236 mounted on the first main surface 231a of the substrate 231 to the mounting part 21 to release the heat.

Modification 4

Figure 9B:
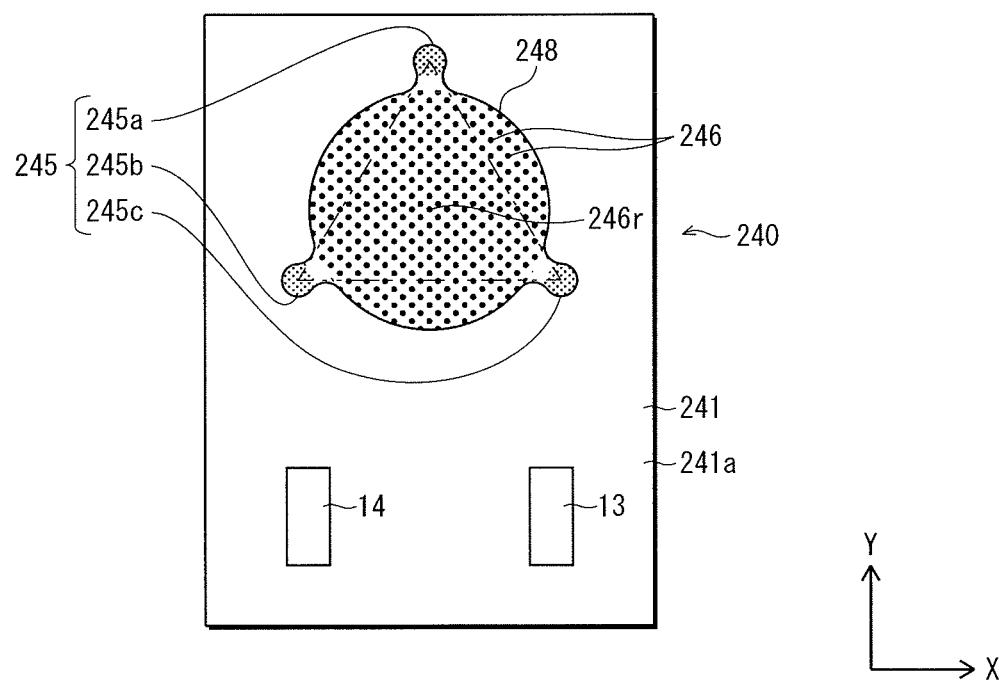
FIG. 9B is a schematic plan view of a light-emitting module 240 pertaining to Modification 4.

The following describes a lighting device pertaining to Modification 4 with reference to FIG. 9B. FIG. 9B is a schematic plan view showing the structure of a light-emitting module 240 provided in the lighting device pertaining to the present modification. The other components are the same as those of Embodiment 1, and therefore they are not illustrated and their explanations are omitted.

As shown in FIG. 9B, the light-emitting module 240 pertaining to the present modification includes mainly: a substrate 241; a plurality of light-emitting elements 246; a sealant 248; and a padding 245. The substrate 241 has connectors 13 and 14 on its first main surface 241a.

In the light-emitting module 240 pertaining to the present modification, as with Modifications 2 and 3 described above, the sealant 248 is formed to cover all the light-emitting elements 246 mounted on the first main surface 241a of the substrate 241. The sealant 248 has an annular shape in plan view, and the center point thereof coincides with the center point 246r of the plurality of light-emitting elements 246.

In the present modification, the padding 245 is composed of three padding portions 245a, 245b and 245c dispersed in the peripheral area surrounding the area where the sealant 248 is disposed. Each of the padding portions 245a, 245b and 245c constituting the padding 245 is connected with the sealant 248.

With the stated structure, the present modification achieves the same advantageous effects as Embodiment 1 described above. In addition, the present modification is further improved in production efficiency.

Modification 5

Figure 10:
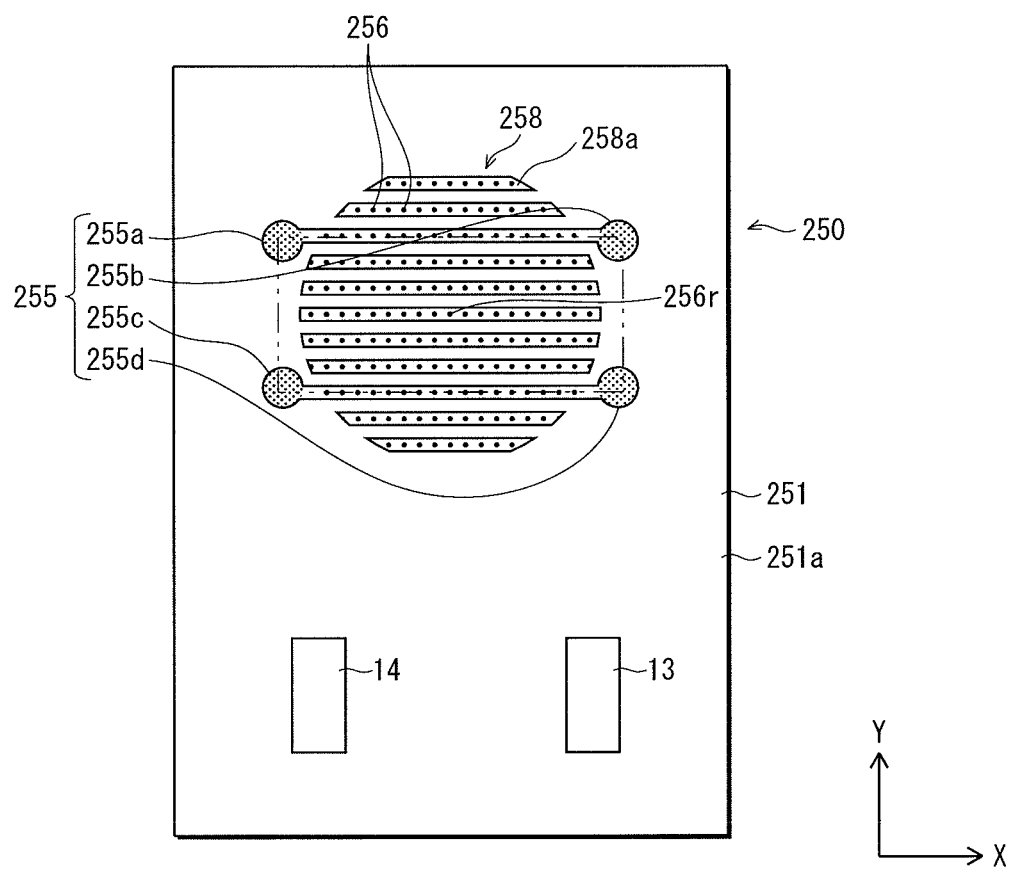
FIG. 10 is a schematic plan view of a light-emitting module 250 pertaining to Modification 5.

The following describes a lighting device pertaining to Modification 5 with reference to FIG. 10. FIG. 10 is a schematic plan view showing the structure of a light-emitting module 250 provided in the lighting device pertaining to the present modification. The other components are the same as those of Embodiment 1, and therefore they are not illustrated and their explanations are omitted.

As shown in FIG. 10, the light-emitting module 250 pertaining to the present modification includes mainly: a substrate 251; a plurality of light-emitting elements 256; a sealant 258; and a padding 255. The substrate 251 has connectors 13 and 14 on its first main surface 251a.

Also in the present modification, the sealant 258 is composed of a plurality of sealant portions 258a, which are separated from each other in the Y axis direction.

In the present modification, the padding 255 is composed of four padding portions 255a, 255b, 255c and 255d which are separated from each other. The padding portions 255a, 255b, 255c and 255d are disposed in the peripheral area surrounding the area where the plurality of light-emitting elements 256 are mounted. Line segments connecting the four padding portions 255a, 255b, 255c and 255d virtually form a rectangle (depicted in two-dotted line in the drawing).

Specifically, line segments connecting any three of the four padding portions 255a, 255b, 255c and 255d virtually form a triangle. Note that there are four combinations when selecting three from the four padding portions 255a, 255b, 255c and 255d. The center point 256r of the plurality of light-emitting elements 256 is located within each of the four triangles.

In the present modification, two of the sealant portions 258a are elongated in the longitudinal direction (i.e. X axis direction), and each end of the two sealant portions is connected with one of the padding portions 255a, 255b, 255c and 255d. Therefore, according to the present modification, the sealant 258 and the padding 255 can be formed by continuously ejecting the application material from the nozzle of the dispenser. With the stated structure, the present modification achieves the same advantageous effects as described above. In addition, the present modification is further improved in production efficiency.

Other Modifications

In addition to the structures according to Embodiments 1 and 2 and Modifications 1 through 5, the following structures may be adopted.

Substrate

The shape of the substrate is not limited to the rectangular plate-like shape adopted in Embodiment 1, and may be any polygonal plate-like shape or circular plate-like shape.

Amount of Deflection in Substrate

When the substrate has a rectangular plate-like shape, the maximum amount of deflection in the substrate may be obtained by the following simple method.

The first step is to measure the length D1 of a diagonal line of the first main surface of the substrate before installing wiring on the first main surface of the substrate. The next step is to measure the length D2 of the diagonal line of the first main surface of the substrate after completing manufacturing of the light-emitting module by installing wiring and mounting electronic parts (including a light-emitter) on the first main surface of the substrate. According to this method, the maximum amount of deflection is defined as a value obtained by subtracting D2 from D1 (i.e. D1−D2).

In addition, it can be assumed that the ratio ((D1−D2)/D1) of the maximum amount of deflection (D1−D2) to the length D1 is constant regardless of the size of the substrate under the condition that the material of the substrate is unchanged and the thickness thereof falls within the range of 0.5 mm to 2.0 mm. Therefore, the maximum amount of deflection can be obtained by simply multiplying the ratio by the length of the diagonal line of the first main surface of the substrate to be used.

Also note that a substrate made of ceramic exhibits a greater maximum amount of deflection than a substrate made of another material. Considering the above, it is possible to simply calculate the maximum amount of deflection of any substrates including substrates made of ceramic and substrates made of another material by setting the ratio ((D1−D2)/D1) for substrates made of ceramic as the standard ratio.

For example, the ratio ((D1−D2)/D1) may be set to approximately 0.5% to obtain an approximated amount of deflection in an actual substrate made of any material.

Padding

In the description above, it is described that when only one padding is provided the padding has an annular shape. However, the padding may have another shape such as a loop shape with corners, C shape, U shape, L shape, zigzag shape and straight shape. When two paddings are provided, their respective shapes may be selected from those described above including the annular shape.

When only one padding having an annular shape is provided, the padding may be located so as not to surround the light-emitter. When only one padding having a non-annular shape is provided, the padding may be located in the vicinity of the light-emitter or at an edge of the substrate. When two padding portions are provided, one of the padding portions may be located to surround the light-emitter, and the other portion may be located to not surround the light-emitter. Alternatively, the two padding portions having a straight shape may be provided along either the long sides or the short sides of the first main surface so as to face each other. When there or more padding portions are provided, the padding portions may be located in the periphery of the substrate instead of in the vicinity of the light-emitter. For example, the padding portions may be located at the four corners of the first main surface.

The optimum number of the padding portions depends on their shape and size. For example, it is desirable to increase the number as the amount of deflection increases.

The padding (or the padding portions) is compressed by the substrate holder in the height direction (i.e. Z axis direction) (See FIG. 6B) within the limitation of compression. Therefore, the gap in the height direction between the first main surface of the substrate and the bottom surface of the concave portion of the substrate holder can be reduced by increasing the pressure of the substrate holder. Adjustment of the gap allows for the reduction of the proportion of the light entering the gap with respect to the light emitted by the light-emitter.

Light-Emitting Elements

The light-emitting elements are mounted on the first main surface (one of the main surfaces) of the substrate. The light-emitting elements may be mounted directly on a printed wring board, or be mounted on a module board and then mounted on a printed wiring board. That is, it is not essential that the light-emitting elements are mounted directly on the substrate as with Embodiment 1, and it is possible to use two kinds of substrates, namely a first substrate and a second substrate. If this is the case, the light-emitting elements are mounted indirectly on the first substrate via the second substrate.

In addition, the light-emitting elements are not necessarily LEDs adopted in Embodiment 1, and may be laser diodes (LDs), or electroluminescent (EL) elements.

Sealant

The shape of the outline of the sealant is not necessarily the circular shape adopted in Embodiment 1, and may be a polygonal shape. Furthermore, the shape of each sealant portion is not necessarily an elongated shape. For example, each sealant portion may be divided in smaller pieces arranged in the row direction.

Substrate Holder

The shape of the substrate holder is not necessarily the shape adopted in Embodiment 1. Insofar as the substrate holder does not cover the light-emitter, the shape of the substrate holder may be variously modified by changing the size of the window. For example, the substrate holder may be configured to press against only the periphery of the first main surface. In the case of Embodiment 1 the substrate holder may have a covering that covers only the four corners and their vicinities of the first main surface of the substrate. The shape of the window is also not limited to the circular shape in plan view adopted in Embodiment 1. The window may have the shape of a polygon such as a triangle and a rectangle. Furthermore, a plurality of substrate holders may be provided. If this is the case, each substrate holder presses against the first main surface of the substrate. However, it should be noted that such an increase in number of parts complicates the manufacturing work.

In Embodiment 1, the bottom surface of the covering of the substrate holder, which faces the first main surface of the substrate, has a flat shape. However, this is not essential and any shape may be adopted insofar as at least a portion of the covering can be in contact with the padding. For example, the covering may have a portion that projects toward the substrate and comes in contact with the padding.

Also, in order to increase the reflectivity of the periphery of the covering defining the window, the surface of the covering may be coated with reflective material with a relatively high reflectivity with respect to visible wavelengths.

REFERENCE SIGNS LIST

1: lighting device
10, 210, 220, 230, 240, 250: light-emitting module
11, 211, 221, 231, 241, 251: substrate
12: light-emitter
15, 215, 225, 235, 245, 255: padding
16: light-emitting elements
18, 218, 228, 238, 248, 258: sealant
20: mount
30: substrate holder
100: downlight

The invention claimed is:

1. A lighting device comprising:
a mount;
a light-emitting module mounted on a main surface of the mount;
a substrate holder covering a portion of the light-emitting module and connected with the mount, wherein
the light-emitting module includes:
  a substrate;
  a plurality of light-emitting elements mounted on a first main surface of the substrate;
  a sealant located on the first main surface of the substrate and sealing the plurality of light-emitting elements; and
  a padding located on the first main surface of the substrate,
the light-emitting module is mounted on the main surface of the mount such that a second main surface of the substrate, which is on the opposite side of the substrate as the first main surface, comes into contact with the main surface of the mount, and the light-emitting module is fixed to the mount by pressure applied from the substrate holder via the padding brought into contact with a surface of the substrate holder, the surface facing toward the main surface of the mount, and
the padding is made of a same material as the sealant.

2. The lighting device of claim 1, wherein
in plan view of the light-emitting module,
  the padding surrounds an area of the first main surface of the substrate, and
  the plurality of light-emitting elements are mounted on the area surrounded by the padding.

3. The lighting device of claim 1, wherein
the padding is composed of at least three padding portions separated from each other.

4. The lighting device of claim 3, wherein
in plan view of the light-emitting module,
  a center point of the plurality of light-emitting elements is located within an area defined by three line segments connecting any three portions out of the padding portions with each other.

5. The lighting device of claim 3, wherein
the plurality of light-emitting elements are grouped in rows,
the sealant is composed of a plurality of sealant portions separated from each other and sealing the rows in one-to-one correspondence, and
each of the plurality of sealant portions is connected with a longitudinal end of a different one of the padding portions.

6. The lighting device of claim 1, wherein
the padding is connected with the sealant.

7. The lighting device of claim 1, wherein
the substrate holder has a tapered hole provided above the plurality of light-emitting elements so as not to cover the plurality of light-emitting elements,
the tapered hole tapers toward the light-emitting module, and
a surface of a side wall of the tapered hole is a reflective surface that reflects light from the plurality of light-emitting elements.

8. The lighting device of claim 1, wherein
under a condition that the light-emitting module is not receiving pressure from the substrate holder, a maximum height of the padding with reference to the first main surface of the substrate is equal to or larger than a maximum amount of deflection in the substrate.

9. The lighting device of claim 1, wherein
under a condition that the light-emitting module is not receiving pressure from the substrate holder, the padding has a smaller maximum height than the sealant with reference to the first main surface of the substrate.

10. The lighting device of claim 1, wherein
the substrate of the light-emitting module is made of a ceramic containing material.

11. A light-emitting module located between a mount and a substrate holder and fixed to the mount, the light-emitting module comprising:
a substrate;
a plurality of light-emitting elements mounted on a first main surface of the substrate;
a sealant located on the first main surface of the substrate and sealing the plurality of light-emitting elements; and
a padding located on the first main surface of the substrate, wherein
the light-emitting module is mounted on a main surface of the mount such that a second main surface of the substrate, which is on the opposite side of the substrate as the first main surface, comes into contact with the main surface of the mount, and the light-emitting module is fixed to the mount by pressure applied from the substrate holder via the padding brought into contact with a surface of the substrate holder, the surface facing toward the main surface of the mount, and
the padding is made of a same material as the sealant.

* * * * *